US009025698B2

(12) United States Patent
Chen et al.

(10) Patent No.: US 9,025,698 B2
(45) Date of Patent: May 5, 2015

(54) METHOD AND DEVICE FOR ACQUIRING MULTI-FREQUENCY BAND DIGITAL PREDISTORTION OUTPUT SIGNALS

(75) Inventors: Dong Chen, Beijing (CN); Fang Xiong, Beijing (CN)

(73) Assignee: China Academy of Telecommunications Technology, Beijing (CN)

(*) Notice: Subject to any disclaimer, the term of this patent is extended or adjusted under 35 U.S.C. 154(b) by 0 days.

(21) Appl. No.: 14/241,084

(22) PCT Filed: Sep. 6, 2012

(86) PCT No.: PCT/CN2012/081058
§ 371 (c)(1),
(2), (4) Date: Feb. 26, 2014

(87) PCT Pub. No.: WO2013/034086
PCT Pub. Date: Mar. 14, 2013

(65) Prior Publication Data
US 2014/0219392 A1  Aug. 7, 2014

(30) Foreign Application Priority Data
Sep. 6, 2011 (CN) .......................... 2011 1 0262027

(51) Int. Cl.
*H04K 1/02* (2006.01)
*H04B 1/62* (2006.01)
(Continued)

(52) U.S. Cl.
CPC ................ *H04B 1/62* (2013.01); *H03F 1/3247* (2013.01); *H04L 27/368* (2013.01); *H03F 3/24* (2013.01); *H03F 2200/111* (2013.01); *H04B 1/0475* (2013.01); *H04B 2001/0425* (2013.01)

(58) Field of Classification Search
CPC ..... H03F 1/3247; H03F 1/3241; H03F 3/245; H04L 27/368; H04B 1/0475; H04B 7/0617; H01Q 1/246

USPC ........... 375/297, 296, 295; 330/149; 455/522; 398/115
See application file for complete search history.

(56) References Cited

U.S. PATENT DOCUMENTS 6,996,378 B2  2/2006  Heims
8,260,143 B2*  9/2012  Gupta et al. .................. 398/115
(Continued)

FOREIGN PATENT DOCUMENTS

CN  102014090 A  4/2011
CN  102255835 A  11/2011
(Continued)

OTHER PUBLICATIONS

International Search Report and Written Opinion for PCT/CN2012/081058.
(Continued)

*Primary Examiner* — Daniel Washburn
*Assistant Examiner* — Fitwi Hailegiorgis
(74) *Attorney, Agent, or Firm* — Kilpatrick Townsend & Stockton LLP

(57) ABSTRACT

The present invention relates to the communications field, discloses a method and device for acquiring multi-frequency band digital predistortion (DPD) output signals, enables the result of DPD processing to compensate the intermodulation of multi-frequency band signal combinations after PA, and improves the ACLR of the signals after PA. Specifically, when performing DPD processing on an input signal received on a working frequency band, reference must be made to the DPD coefficients generated from the feedback signals of the signals previously received on the working frequency band and on other working frequency bands, and to the input signals currently received on other working frequency bands. In other words, intermodulation between the input signals received on working frequency bands are taken into consideration during the DPD processing work flow, so that the result of DPD processing can compensate the intermodulation of the multi-frequency band signal combinations after PA, and improves the accuracy of DPD processing, thereby enhancing the ACLR after wide band power amplification.

14 Claims, 2 Drawing Sheets

(51) Int. Cl.
*H03F 1/32* (2006.01)
*H04L 27/36* (2006.01)
*H03F 3/24* (2006.01)
*H04B 1/04* (2006.01)

(56) References Cited

U.S. PATENT DOCUMENTS

2001/0054974 A1   12/2001  Wright
2003/0053552 A1*   3/2003  Hongo et al. ................. 375/295
2011/0009153 A1*   1/2011  Chiba et al. .................. 455/522
2011/0156815 A1   6/2011  Kim et al.

FOREIGN PATENT DOCUMENTS

CN       102299878 A   12/2011
WO     2012/112360 A1   8/2012

OTHER PUBLICATIONS

European Search Report for European counterpart application 12829525.0.

* cited by examiner

METHOD AND DEVICE FOR ACQUIRING MULTI-FREQUENCY BAND DIGITAL PREDISTORTION OUTPUT SIGNALS

This application is a US National Stage of International Application No. PCT/CN2012/081058, filed on 6 Sep. 2012, designating the United States, and claiming priority from Chinese Patent Application No. 201110262027.4, filed with the Chinese Patent Office on Sep. 6, 2011 and entitled "Implementation method and device for multi-band DPD", which is hereby incorporated by reference in its entirety.

FIELD OF THE INVENTION

The present invention relates to the field of communications and particularly to a method and device for acquiring multi-band Digital Pre-Distortion (DPD) output signals.

BACKGROUND OF THE INVENTION

Along with high acceptance by domestic and foreign mobile operators, large-scale commercial deployment in recent years, the network deployment pattern with a Base Band Unit (BBU) and a Radio Remote Unit (RRU) has presented the trend of changing the traditional network architecture fundamentally. Due to the differences between the spectrum policies of respective countries and regions, spectrum resources available to global mobile operators are relatively decentralized, and there is a common multi-standard and multi-band challenge. For example, China Mobile has been assigned sequentially with four bands of F (1880 MHz-1920 MHz), A (2010 MHz-20251 MHz), E (2320 MHz-23701 MHz) and D (2570 MHz-2620 MHz) in the Time Division Synchronized Code Division Multiple Access (TD-SCDMA) system. In order to lower the equipment cost and satisfy the demand of the TD network for applicability to different bands and different scenarios, there have been more than ten types of RRU products, each of which is intended for a fixed narrow band and also referred to a narrow-band RRU product. However even a predominating manufacturer finds it difficult to cover all the bands with the existing narrow-band RRU products, and moreover the existing narrow-band RRU products have to be replaced once the frequency band assignment scheme is adjusted again in the future, all of which promote the development of the radio frequencies of the RRU products towards the broadband direction as soon as possible.

In order to implement the broadband of the radio frequencies, a crucial technology is broadband power amplification. In traditional technologies, it is required to use multiple narrow-band RRU products in multi-band network deployment, it is difficult to set up and maintain stations, and the replacement of equipments is frequent when the capacity is extended, to thereby go against lowering the cost of the equipments. The use of a broadband RRU product based upon the broadband power amplification technology can greatly reduce the demand of the system for the number of RRU products and facilitate the long-term and stable development of the network; and in the meantime, as compared with the narrow-band RRU products in the traditional technologies, both the weight and the volume of the broadband RRU product are greatly reduced along with the increasing of the number of bands, which can facilitate a rapid engineering practice; and as compared with RRU products in which power amplifiers corresponding to multiple bands are combined simply in the traditional technologies, the broadband RRU product has a reduced number of electronic elements, improved reliability and lowered power consumption.

For the broadband RRU product, the broadband Digital Pre-Distortion (DPD) technology supporting multiple bands is one of core technologies of research and development on the broadband RRU product. In the prior art, the multi-band (for example, 3-band or more) DPD has to be performed only by combining multiple single-band DPD systems directly, which makes the equipment of the broadband RRU product bulky, inefficient and costly in contradiction with the technical evolvement requirement; and the respective single-band DPD systems are combined directly without taking their mutual interference into account, so a processing result of DPD can not accurately reflect the real performance of the combined respective DPD systems, which goes against the application of a following broadband power amplifier.

SUMMARY OF THE INVENTION

Embodiments of the invention provide a method and device for acquiring multi-band digital pre-distortion output signals so as to enable the processing result of the digital pre-distortion to truly reflect the real performance of a combination of multiple bands after a power amplifier and further improve the application performance of the following broadband power amplifier.

A method for acquiring multi-band Digital Pre-Distortion (DPD) output signals includes:

receiving at least two input signals in different working frequency bands;

determining DPD coefficients corresponding to the input signals currently received in the respective working frequency bands, wherein a DPD coefficient corresponding to an input signal currently received in any working frequency band is obtained according to feedback signals of respective input signals previously received in the respective working frequency bands and an input signal previously received in the any working frequency band; and acquiring DPD output signals corresponding to the input signals currently received in the respective working frequency bands respectively according to the input signals currently received in the respective working frequency bands and their corresponding DPD coefficients, and input signals currently received in interfering frequency bands of the respective working frequency bands.

A device for acquiring multi-band Digital Pre-Distortion (DPD) output signals includes:

an interface module configured to receive at least two input signals in different working frequency bands;

a DPD training module configured to determine DPD coefficients corresponding to the input signals currently received in the respective working frequency bands, wherein a DPD coefficient corresponding to an input signal currently received in any working frequency band is obtained according to feedback signals of respective input signals previously received in the respective working frequency bands and an input signal previously received in the any working frequency band; and a DPD processing module configured to acquire DPD output signals corresponding to the input signals currently received in the respective working frequency bands respectively according to the input signals currently received in the respective working frequency bands and their corresponding DPD coefficients, and input signals currently received in interfering frequency bands of the respective working frequency bands.

An RRU includes the foregoing device.

In the embodiments of the invention, a new DPD mathematic model is designed for input signals received in multiple working frequency bands and characterized in that when the DPD processing is performed on the input signal received in any working frequency band, it is required to refer to DPD coefficients generated based upon feedback signals of input signals previously received in this working frequency band and other working frequency bands and also refer to input signals currently received in the other working frequency bands, that is, during the DPD processing flow, inter-modulation effects between the input signals received in the respective working frequency bands are taken into account, so that the DPD processing result can compensate for the inter-modulation characteristic of the multi-band signal combination after passing through a PA, to thereby improve the accuracy of the DPD processing result and further improve the Adjacent Channel Leakage power Ratio (ACLR) performance after the broadband power amplifier, and the same signal processing device can be applicable to a broader frequency range even though the frequency band assignment scheme is modified, to thereby effectively reduce the production cost of the signal processing device and also lower the complexity of performing the DPD processing flow.

DETAILED DESCRIPTION OF THE EMBODIMENTS

In the processing flow of a multi-band data signal, in order to enable the processing result of digital pre-distortion to compensate for the inter-modulation characteristic of the multi-band signal combination after passing through a PA and further improve the ACLR performance of the signals after passing through the broadband power amplifier, in an embodiment of the invention, after receiving at least two input signals respectively in different working frequency bands and when performing DPD processing on an input signal currently received in any working frequency band, a processing device needs to refer to input signals currently received in interfering frequency bands and feedback signals of input signals previously received in the working frequency band and the interfering frequency bands, that is, take mutual effects between respective inputs signals into account, to thereby enable the processing result of DPD to truly reflect the characteristic of the broadband power amplifier.

A preferred embodiment of the invention will be described below in details with reference to the drawings.

Figure 1:
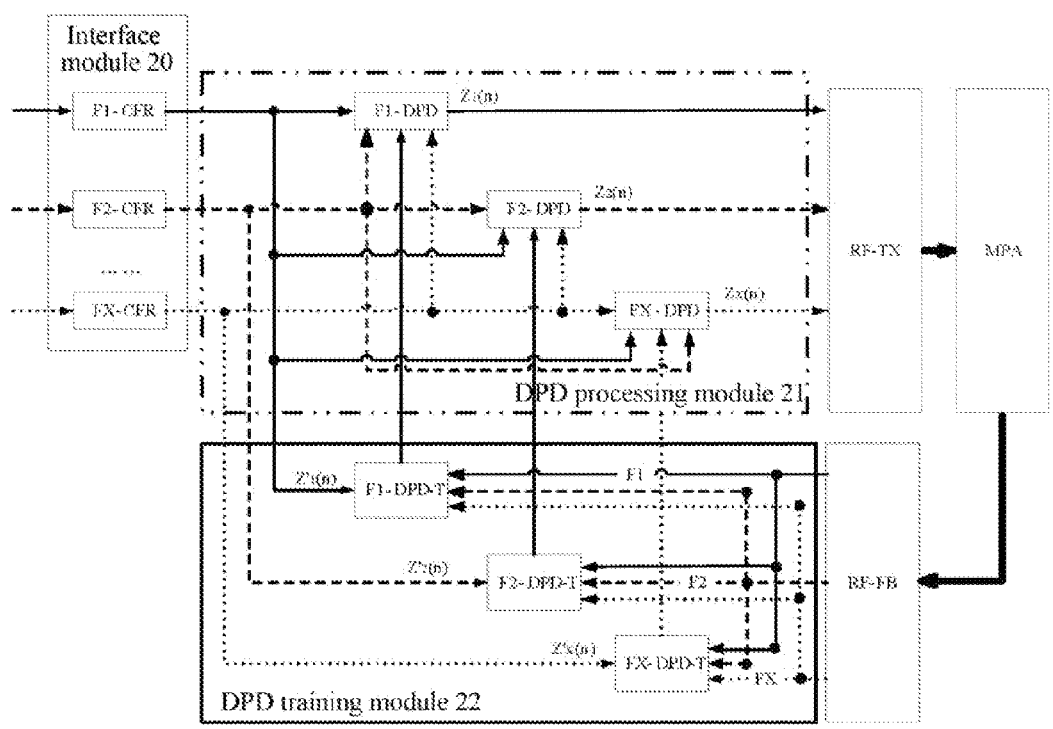
FIG. 1 is a schematic functional structure diagram of a signal processing device according to an embodiment of the invention.

Referring to FIG. 1, in an embodiment of the invention, a signal processing device includes an interface module 20 and a DPD processing module 21.

The interface module 20 is configured to receive at least two input signals in different working frequency bands; and The DPD processing module 21 is configured to acquire DPD output signals corresponding to the input signals currently received in the respective working frequency bands respectively according to the input signals currently received in the respective working frequency bands and their corresponding DPD coefficients, and input signals currently received in interfering frequency bands of the respective working frequency bands.

Furthermore, the signal processing device is further provided with a DPD training module 22 therein to generate the DPD coefficients, where a DPD coefficient corresponding to an input signal currently received in any working frequency band is obtained according to feedback signals of respective input signals previously received in the respective working frequency bands and an input signal previously received in the any working frequency band. Particular functions of the DPD training module 22 will be introduced in following embodiments, and the description thereof is omitted here.

FIG. 1 illustrates only a preferred embodiment of the signal processing device, and the description thereof is omitted here.

On the other hand, in an embodiment of the invention, the above-mentioned signal processing device can be a functional module in an RRU or a separately operating device connected with an RRU, and the description thereof is omitted here.

Figure 2:
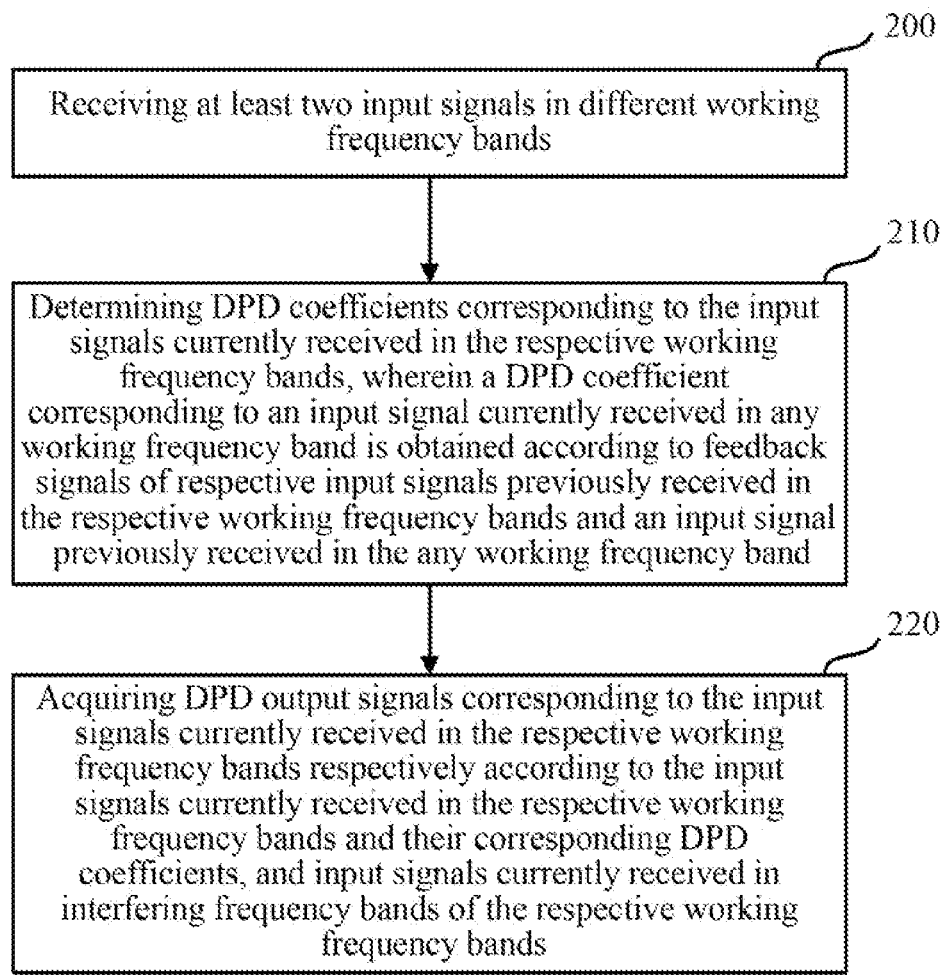
FIG. 2 is a flow chart of DPD processing on input signals received in multiple working frequency bands according to an embodiment of the invention.

Based upon the foregoing technical solution, in an embodiment of the invention, a new DPD mathematic model is designed, and the signal processing device can perform DPD processing on received multi-band input signals using the DPD mathematic model, and as illustrated in FIG. 2, the specific flow thereof is as follows:

Step 200: receiving at least two input signals in different working frequency bands.

In a practical application, the multiple input signals in the different working frequency bands can include an F1 signal, an F2 signal, . . . , and an FX signal, and referring to FIG. 1, in this embodiment, only three signals including the F1 signal, the F2 signal and the FX signal will be introduced as an example, where F1, F2 and FX represent the working frequency bands in which the respective input signals locate respectively.

Preferably the F1 signal, the F2 signal and the FX signal received by the signal receiving device can be base-band signals after the crest factor reduction, for example, as illustrated in FIG. 1, the Crest Factor Reduction (CFR) processing is performed on the F1 signal, the F2 signal and the FX signal respectively by an F1-CFR sub-module, an F2-CFR sub-module and an FX-CFR sub-module in the interface module 20 and then the processed signals enter subsequent processing stages.

Step 210: determining DPD coefficients corresponding to the input signals currently received in the respective working frequency bands, wherein a DPD coefficient corresponding to an input signal currently received in any working frequency band is obtained according to feedback signals of respective input signals previously received in the respective working frequency bands and an input signal previously received in the any working frequency band.

In the step 210, the so-called "previously received" can be "immediately previously received" or "further previously received" or "even further previously received" or the like, because it may not be necessary to adjust DPD coefficients corresponding to input signals received next in the respective working frequency bands respectively each time feedback signals of input signals in the respective working frequency bands are received, and if the system performance is relatively stable, then it is very likely that DPD coefficients used by input signals in any working frequency band in the DPD processing performed consecutively for several times are the same when the DPD processing is performed on the input signals received in the respective working frequency bands consecutively for several times.

On the other hand, in the signal processing procedure, the DPD training module 22 in the signal processing device generates the DPD coefficient corresponding to the input signal currently received in the any working frequency band according to the feedback signals of the respective input signals previously received in the respective working frequency bands and the input signal previously received in the any working frequency band specifically as follows:

Step A: determining the input signal previously received in the any working frequency band.

Step B: determining a feedback signal of the input signal previously received in the any working frequency band.

Step C: determining feedback signals of respective input signals previously received in interfering frequency bands of the any working frequency band, where the so-called interfering frequency bands are other working frequency bands than the any working frequency band.

For example, when a DPD coefficient is configured for an input signal received in F1, F1 is a working frequency band, and F2 and FX are interfering frequency bands; when a DPD coefficient is configured for an input signal received in F2, F2 is a working frequency band, and F1 and FX are interfering frequency bands; and when a DPD coefficient is configured for an input signal received in FX, FX is a working frequency band, and F1 and F2 are interfering frequency bands.

Step D: calculating the DPD coefficient corresponding to the input signal currently received in the any working frequency band according to the input signal previously received in the any working frequency band and its feedback signal, the feedback signals of the respective input signals previously received in the interfering frequency bands of the any working frequency band, and preset weight coefficients.

Preferably the step D can be performed to calculate the DPD coefficients in Formula 1 of:

$$z'_r(n) = \sum_{q=0}^{Q-1} y'_f(n-q) \cdot \sum_{k=0}^{K-1} a_{k,q} \sum_{m=0}^{k} \left( b_{k,m} |y'_f(n-q)|^{k-m} \left( \sum_{s=1}^{S} |y'_s(n-q)|^2 \right)^{m/2} \right)$$

Formula 1

Wherein:

K represents a preset nonlinear order;

Q represents a preset memory depth;

n represents a sequence number of a sample;

m represents a preset parameter of which a value is an even umber; and $z'_r(n)$ represents the input signal previously received in the any working frequency band.

For example, referring to FIG. 1, $z'_1(n)$ and $z'_2(n)$ and $z'_x(n)$ can be regarded as the input signals previously received respectively in the working frequency bands F1, F2 and FX.

$y'_f(n-q)$ represents the feedback signal of the input signal previously received in the any working frequency band.

For example, referring to FIG. 1, after the input signal $z'_1(n)$ previously received in the working frequency band F1 is processed by the DPD processing module 21, its DPD output signal is returned to the DPD training module 22 through an RF-TX (a radio frequency transmission channel)->an MPA (a broadband power amplifier)->an RF-FB (a radio frequency feedback channel) and transmitted respectively to an F1-DPD-T sub-module, an F2-DPD-T sub-module and an FX-DPD-T sub-module in the DPD training module 22 to calculate the DPD coefficient of the input signal currently received in F1, the DPD coefficient of the input signal currently received in F2 and the DPD coefficient of the input signal currently received in FX respectively, where when the DPD coefficient of the input signal received in F1 is calculated, the feedback signal corresponding to $z'_1(n)$ is used as the feedback signal of the input signal currently received in the working frequency band, and when the DPD coefficients of the input signals received in F2 and FX are calculated respectively, the feedback signal corresponding to $z'_1(n)$ is used as the feedback signal of the input signal currently received in the interfering frequency band; and similarly the input signal $z'_2(n)$ previously received in the working frequency band F2 and the input signal $z'_x(n)$ previously received in the working frequency band FX are used in the same way as $z'_1(n)$ so a repeated description hereof will be omitted here.

$y'_s(n-q)$ represents feedback signals of input signals previously received in S interfering frequency bands, and in the embodiment of the invention, an application scenario with S>2 will be taken as an example for illustration.

For example, when the DPD coefficient of the input signal received in F1 is configured, $y'_f(n-q)$ represents the feedback signals of the input signals received in F2 and FX, where S is the number of interfering frequency bands.

$a_{k,q}$ one of K DPD coefficients at a memory depth of q and has a value in the range of $a_{0,q}$ to $a_{K-1,q}$, that is, when the memory depth is q, there are K DPD coefficients corresponding to an input signal in any working frequency band.

$b_{k,m}$ represents a preset weight coefficient used to characterize the extent to which an input signal previously received in a working frequency band and an input signal previously received in an interfering frequency band interfere with each other and is preconfigured by an administrator according to experience.

With all of $z'_r(n)$, $y'_f(n-q)$ and $y'_s(n-q)$ known, any of the DPD coefficients $a_{k,q}$ can be derived in the above Formula 1.

Step 220: acquiring DPD output signals corresponding to respective currently received input signals respectively according to the respective input signals, the DPD coefficients corresponding to the respective input signals and interference signals corresponding to the respective input signals.

In the procedure of performing the step 220, the signal processing device acquires the DPD output signal corresponding to the input signal currently received in the any working frequency band respectively according to the input signal currently received in the any working frequency band and its corresponding DPD coefficient, and input signals currently received in the interfering frequency bands of the any working frequency band specifically as follows:

Step O: determining the input signal currently received in the any working frequency band.

Step P: determining the respective input signals currently received in the interfering frequency bands of the any working frequency band, where the so-called interfering frequency bands are other working frequency bands than the any working frequency band.

Step Q: acquiring the DPD output signal corresponding to the input signal currently received in the any working frequency band according to the input signal currently received in the any working frequency band and its corresponding DPD coefficient, the respective input signals currently received in the interfering frequency bands of the any working frequency band, and preset weight coefficients.

Preferably the step Q can be performed in Formula 2 of:

$$z_r(n) = \sum_{q=0}^{Q-1} y_f(n-q) \cdot \sum_{k=0}^{K-1} a_{k,q} \sum_{m=0}^{k} \left( b_{k,m} |y_f(n-q)|^{k-m} \left( \sum_{s=1}^{S} |y_s(n-q)|^2 \right)^{m/2} \right)$$

Formula 2

Wherein:

K represents a preset nonlinear order:

Q represents a preset memory depth;

n represents a sequence number of a sample;

m represents a preset parameter of which a value is an even number; and $z_r(n)$ represents the DPD output signal corresponding to the input signal currently received in the any working frequency band.

For example, referring to FIG. 1, $z_1(n)$, $z_2(n)$ and $z_x(n)$ can be regarded as the DPD output signals corresponding to the input signals currently received respectively in the working frequency bands F1, F2 and FX.

$y_f(n-q)$ represents the input signal currently received in the any working frequency band.

For example, referring to FIG. 1, after the input signal currently received in the working frequency band F1 is transmitted to and processed by the DPD processing module 21, the input signal is transmitted respectively to an F1-DPD sub-module, an F2-DPD sub-module and an FX-DPD sub-module in the DPD processing module 21 to calculate the DPD output signal corresponding to the input signal currently received in F1, the DPD output signal corresponding to the input signal currently received in F2 and the DPD output signal corresponding to the input signal currently received in FX respectively, where when the DPD output signal corresponding to the input signal currently received in F1 is calculated, the input signal currently receive in F1 is used as the input signal currently received in the working frequency band, and when the DPD output signals corresponding to the input signals currently received in F2 and FX are calculated respectively, the input signal currently received in F1 is used as the input signal currently received in the interfering frequency band; and similarly the input signal currently received in the working frequency band F2 and the input signal currently received in the working frequency band FX are used in the same way as the input signal currently received in the working frequency band F1, so a repeated description thereof will be omitted here.

$y_s(n-q)$ represents input signals currently received in S interfering frequency bands, and in the embodiment of the invention, an application scenario with S>2 will be taken as an example for illustration.

For example, when the DPD output signal corresponding to the input signal currently received in F1 is calculated, $y_s(n-q)$ represents the input signals currently received in F2 and FX, where S is the number of interfering frequency bands.

$a_{k,q}$ represents one of K DPD coefficients at a memory depth of q and has a value in the range of $a_{0,q}$ to $a_{K-1,q}$, that is, when the memory depth is q, there are K DPD coefficients corresponding to an input signal in any working frequency band.

$b_{k,m}$ represents a preset weight coefficient used to characterize the extent to which an input signal previously received in a working frequency band and an input signal previously received in an interfering frequency band interfere with each other and is preconfigured by an administrator according to experience.

With all of the K DPD coefficients, $y_f(n-q)$ and $y_s(n-q)$ known, a DPD output signal $z_r(n)$ corresponding to an input signal currently received in any working frequency band can be derived in the above Formula 2.

Based upon the foregoing embodiment, after the DPD output signals corresponding to the input signals currently received in the respective working frequency bands are acquired, the respective DPD output signals are processed and then transmitted by the RF-TX and the MPA, and corresponding feedback signals are obtained by the RF-FB to calculate DPD coefficients corresponding to input signals subsequently received in the respective working frequency bands, that is, after acquiring the DPD output signal corresponding to the input signal currently received in the any working frequency band, the signal processing device needs to feed the DPD output signal back to the DPD training module 22 through the RF-TX->the MPA->the RF-FB, that is, the corresponding feedback signals are transmitted respectively to the F1-DPD-T sub-module, the F2-DPD-T sub-module and the FX-DPD-T sub-module in the DPD training module 22 to calculate the DPD coefficients corresponding to the input signals subsequently received in the respective working frequency bands. For example, after processing $z_1(n)$ through the RF-TX->the MPA->the RF-FB, the signal processing device transmits the corresponding feedback signal respectively to the F1-DPD-T sub-module, the F2-DPD-T sub-module and the FX-DPD-T sub-module in the DPD training module 22 to obtain DPD coefficients corresponding to input signals subsequently received F1, F2 and FX, where when the DPD coefficient corresponding to the input signal subsequently received in F1 is calculated, the feedback signal of $z_1(n)$ is used as the feedback signal of the input signal previously received in the working frequency band, and when the DPD coefficients corresponding to the input signals subsequently received in F2 and FX are calculated respectively, the feedback signal of $z_1(n)$ is used as the feedback signal of the input signal previously received in the interfering frequency band, and reference can be made to Formula 1 for details, so a repeated description thereof will be omitted here. Similarly the DPD output signal $z_2(n)$ in the working frequency band F2 and the DPD output signal $z_x(n)$ in the working frequency band FX are subsequently processed in the same way as $z_1(n)$, so a repeated description thereof will be omitted here.

Referring to FIG. 1, when the signal processing device processes the DPD output signals corresponding to the respective input signals currently received in the respective working frequency bands through the RF-TX, the RF-TX can firstly combine the respective DPD output signals in the digital domain, then perform digital to analog conversion on the combined DPD output signals using a uniform Digital to Analog Converter (DAC) and modulate the converted DPD output signals to a radio frequency point, and finally transmit them to the broadband power amplifier for transmission; or the RF-TX can firstly perform digital to analog conversion on the respective DPD output signals using corresponding DACs, then combine the respective converted DPD output signals in the analog domain and modulate the combined DPD output signals to a radio frequency point, and finally transmit them to the broadband power amplifier for transmission.

After the combined radio frequency signals enter the MPA, output signals are coupled to the RF-RX, and the RF-RX filters out the feedback signals in the respective working frequency bands respectively using multiple broadband radio frequency filters through switching time division of a radio frequency switch, and next the RF-RX can performing down-conversion on the feedback signals in the respective working frequency bands and then output them directly to the DPD training module 22 through a uniform Analog to Digital Converter (ADC) to calculate the DPD coefficients corresponding to the input signals subsequently received in the respective working frequency bands, or the RF-RX can directly performing down-conversion on the feedback signals in the respective working frequency bands and then output broadband signals through corresponding ADCs respectively, and further perform spectrum shifting and digital filtering respectively on the broadband signals in respective working frequency bands and then transmit them to the DPD training module 22 to calculate the DPD coefficients corresponding to the input signals subsequently received in the respective working frequency bands.

In summary, in the embodiments of the invention, a new DPD mathematic model is designed for input signals received in multiple working frequency bands and characterized in that when the DPD processing is performed on the input signal received in any working frequency band, it is required to refer to DPD coefficients generated based upon feedback signals of input signals previously received in this working frequency band and other working frequency bands and also refer to input signals currently received in the other working frequency bands (i.e., interfering frequency bands), that is, during the DPD processing flow, inter-modulation effects between the input signals received in the respective working frequency bands are taken into account, so that the data after the DPD processing can pre-compensate for the inter-modulation effects between the multi-band signals after passing through a PA to thereby improve the ACLR performance of the signals after passing through the PA. For example, in the application scenario as illustrated in FIG. 1, in the existing DPD processing flow, is required to arrange an MPA respectively for each of the DPD output signals in F1, F2 and FX, while in the DPD processing flow described in the embodiments of the invention, the inter-modulation effects between the input signals in F1, F2 and FX are taken into account, so that only one MPA needs to be arranged for the respective DPD output signals in F1, F2 and FX, that is, the respective DPD output signals in F1, F2 and FX can be transmitted through the same MPA after being combined so that the same signal processing device can be applicable to a broader frequency range even though the frequency band assignment scheme is modified, to thereby effectively reduce the production cost of the signal processing device and also lower the complexity of performing the DPD processing flow.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore, the invention can be embodied in the form of a computer program product embodied in one or more computer useable storage mediums (including but not limited to a disk memory, a CD-ROM, an optical memory, etc.) in which computer useable program codes are contained.

The invention has been described with reference to flow charts and/or block diagrams of the method, the device (system) and the computer program product according to the embodiments of the invention. It shall be appreciated that respective flows and/or blocks in the flow charts and/or the block diagrams and combinations of the flows and/or the blocks in the flow charts and/or the block diagrams can be embodied in computer program instructions. These computer program instructions can be loaded onto a general-purpose computer, a specific-purpose computer an embedded processor or a processor of another programmable data processing device to produce a machine so that the instructions executed on the computer or the processor of the other programmable data processing device create means for performing the functions specified in the flow(s) of the flow charts and/or the block(s) of the block diagrams.

These computer program instructions can also be stored into a computer readable memory capable of directing the computer or the other programmable data processing device to operate in a specific manner so that the instructions stored in the computer readable memory create manufactures including instruction means which perform the functions specified in the flow(s) of the flow charts and/or the block(s) of the block diagrams.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow charts and/or the block(s) of the block diagrams.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as these modifications and variations come into the scope of the claims appended to the invention and their equivalents.

The invention claimed is:

1. A method for acquiring multi-band digital pre-distortion (DPD) output signals, comprising:
   receiving at least two input signals in different working frequency bands;
   determining DPD coefficients corresponding to the input signals currently received in the respective working frequency bands, wherein a DPD coefficient corresponding to an input signal currently received in any working frequency band is obtained according to feedback signals of respective input signals previously received in the respective working frequency bands and an input signal previously received in the any working frequency band; and
   acquiring DPD output signals corresponding to the input signals currently received in the respective working frequency bands respectively according to the input signals currently received in the respective working frequency bands and their corresponding DPD coefficients, and input signals currently received in interfering frequency bands of the respective working frequency bands.

2. The method according to claim 1, wherein generating the DPD coefficient corresponding to the input signal currently received in the any working frequency band according to the feedback signals of the respective input signals previously received in the respective working frequency bands and the input signal previously received in the any working frequency band comprises:
- determining the input signal previously received in the any working frequency band;
- determining a feedback signal of the input signal previously received in the any working frequency band;
- determining feedback signals of respective input signals previously received in interfering frequency bands of the any working frequency band, wherein the interfering frequency bands are other working frequency bands than the any working frequency band; and
- calculating the DPD coefficient corresponding to the input signal currently received in the any working frequency band according to the input signal previously received in the any working frequency band and its feedback signal, the feedback signals of the respective input signals previously received in the interfering frequency bands of the any working frequency band, and preset weight coefficients.

3. The method according to claim 2, wherein acquiring a DPD output signal corresponding to the input signal currently received in the any working frequency band respectively according to the input signal currently received in the any working frequency band and its corresponding DPD coefficient, and input signals currently received in the interfering frequency bands of the any working frequency band comprises:
- determining the input signal currently received in the any working frequency band;
- determining the respective input signals currently received in the interfering frequency bands of the any working frequency band, wherein the interfering frequency bands are other working frequency bands than the any working frequency band; and
- acquiring the DPD output signal corresponding to the input signal currently received in the any working frequency band according to the input signal currently received in the any working frequency band and its corresponding DPD coefficient, the respective input signals currently received in the interfering frequency bands of the any working frequency band, and preset weight coefficients.

4. The method according to claim 1, wherein acquiring a DPD output signal corresponding to the input signal currently received in the any working frequency band respectively according to the input signal currently received in the any working frequency band and its corresponding DPD coefficient, and input signals currently received in the interfering frequency bands of the any working frequency band comprises:
- determining the input signal currently received in the any working frequency band;
- determining the respective input signals currently received in the interfering frequency bands of the any working frequency band, wherein the interfering frequency bands are other working frequency bands than the any working frequency band; and
- acquiring the DPD output signal corresponding to the input signal currently received in the any working frequency band according to the input signal currently received in the any working frequency band and its corresponding DPD coefficient, the respective input signals currently received in the interfering frequency bands of the any working frequency band, and preset weight coefficients.

5. The method according to claim 4, wherein after the DPD output signals corresponding to the input signals currently received in the respective working frequency bands are acquired, the respective DPD output signals are processed and then transmitted by a radio frequency transmission channel and a broadband power amplifier, and corresponding feedback signals are obtained by a radio frequency feedback channel to calculate DPD coefficients corresponding to input signals subsequently received in the respective working frequency bands.

6. The method according to claim 5, wherein processing and then transmitting the respective DPD output signals by the radio frequency transmission channel and the broadband power amplifier comprises:
- after the respective DPD output signals are transmitted to the radio frequency transmission channel, the radio frequency transmission channel combining the respective DPD output signals in a digital domain, performing digital to analog conversion on the combined DPD output signals using a uniform digital to analog converter, and then modulating the converted DPD output signals to a radio frequency point and transmitting them to the broadband power amplifier for transmission; or
- after the respective DPD output signals are transmitted to the radio frequency transmission channel, the radio frequency transmission channel performing digital to analog conversion on the respective DPD output signals using corresponding digital to analog converters respectively, combining the respective converted DPD output signals in an analog domain, and then modulating the combined DPD output signals to a radio frequency point and transmitting them to the broadband power amplifier for transmission.

7. The method according to claim 5, wherein obtaining the corresponding feedback signals by the radio frequency feedback channel to calculate the DPD coefficients corresponding to the input signals subsequently received in the respective working frequency bands comprises:
- after output signals transmitted by the broadband power amplifier are coupled to the radio frequency feedback channel, the radio frequency feedback channel filtering out the feedback signals in the respective working frequency bands respectively using multiple broadband radio frequency filters; and
- the radio frequency feedback channel performing down-conversion on the feedback signals in the respective working frequency bands and then performing analog to digital conversion on them using a uniform analog to digital converter, and calculating the DPD coefficients corresponding to the input signals subsequently received in the respective working frequency bands according to the converted feedback signals in the respective working frequency bands; or the radio frequency feedback channel performing down-conversion on the feedback signals in the respective working frequency bands and then performing digital to analog conversion on them using corresponding analog to digital converters respectively, performing spectrum shifting and digital filtering respectively on the converted feedback signals in the respective working frequency bands and calculating the DPD coefficients corresponding to the input signals subsequently received in the respective working frequency bands according to the processed feedback signals in the respective working frequency bands.

8. A device for acquiring multi-band digital pre-distortion (DPD) output signals, comprising:
- an interface module configured to receive at least two input signals in different working frequency bands;

a DPD training module configured to determine DPD coefficients corresponding to the input signals currently received in the respective working frequency bands, wherein a DPD coefficient corresponding to an input signal currently received in any working frequency band is obtained according to feedback signals of respective input signals previously received in the respective working frequency bands and an input signal previously received in the any working frequency band; and a DPD processing module configured to acquire DPD output signals corresponding to the input signals currently received in the respective working frequency bands respectively according to the input signals currently received in the respective working frequency bands and their corresponding DPD coefficients, and input signals currently received in interfering frequency bands of the respective working frequency bands.

9. The device according to claim 8, wherein the DPD training module is specifically configured to configure the DPD coefficients, and the DPD training module configures the DPD coefficient corresponding to the input signal currently received in the any working frequency band according to the feedback signals of the respective input signals previously received in the respective working frequency bands and the input signal previously received in the any working frequency band by: determining the input signal previously received in the any working frequency band, a feedback signal of the input signal previously received in the any working frequency band and feedback signals of respective input signals previously received in interfering frequency bands of the any working frequency band, wherein the interfering frequency bands are other working frequency bands than the any working frequency band; and calculating the DPD coefficient corresponding to the input signal currently received in the any working frequency band according to the input signal previously received in the any working frequency band and its feedback signal, the feedback signals of the respective input signals previously received in the interfering frequency bands of the any working frequency band, and preset weight coefficients.

10. The device according to claim 9, wherein the DPD training module acquires a DPD output signal corresponding to the input signal currently received in the any working frequency band respectively according to the input signal currently received in the any working frequency band and its corresponding DPD coefficient, and input signals currently received in the interfering frequency bands of the any working frequency band by: determining the input signal currently received in the any working frequency band and the respective input signals currently received in the interfering frequency bands of the any working frequency band, wherein the interfering frequency bands are other working frequency bands than the any working frequency band; and the DPD processing module acquires the DPD output signal corresponding to the input signal currently received in the any working frequency band according to the input signal currently received in the any working frequency band and its corresponding DPD coefficient, the respective input signals currently received in the interfering frequency bands of the any working frequency band, and preset weight coefficients.

11. The device according to claim 10, wherein after the DPD processing module acquires the DPD output signals corresponding to the input signals currently received in the respective working frequency bands, the DPD processing module processes and then transmits the respective DPD output signals through a radio frequency transmission channel and a broadband power amplifier, and the DPD training module obtains corresponding feedback signals through a radio frequency feedback channel to calculate DPD coefficients corresponding to input signals subsequently received in the respective working frequency bands.

12. The device according to claim 11, wherein the DPD processing module processes and then transmits the respective DPD output signals through the radio frequency transmission channel and the broadband power amplifier specifically as follows:

after the respective DPD output signals are transmitted to the radio frequency transmission channel, the radio frequency transmission channel combines the respective DPD output signals in a digital domain, performs digital to analog conversion on the combined DPD output signals using a uniform digital to analog converter, and then modulates the converted DPD output signals to a radio frequency point and transmits them to the broadband power amplifier for transmission; or after the respective DPD output signals are transmitted to the radio frequency transmission channel, the radio frequency transmission channel performs digital to analog conversion on the respective DPD output signals using corresponding digital to analog converters respectively, combines the respective converted DPD output signals in an analog domain, and then modulates the combined DPD output signals to a radio frequency point and transmits them to the broadband power amplifier for transmission.

13. The device according to claim 11, wherein the DPD training module obtains the corresponding feedback signals through the radio frequency feedback channel to calculate the DPD coefficients corresponding to the input signals subsequently received in the respective working frequency bands specifically as follows:

after the broadband power amplifier couples transmitted output signals to the radio frequency feedback channel, the radio frequency feedback channel filters out the feedback signals in the respective working frequency bands respectively using multiple broadband radio frequency filters; and the radio frequency feedback channel performs down-conversion on the feedback signals in the respective working frequency bands and then performs analog to digital conversion on them using a uniform analog to digital converter, and the DPD training module calculates the DPD coefficients corresponding to the input signals subsequently received in the respective working frequency bands according to the converted feedback signals in the respective working frequency bands; or the radio frequency feedback channel performs down-conversion on the feedback signals in the respective working frequency bands and then performs digital to analog conversion on them using corresponding analog to digital converters respectively, and performs spectrum shifting and digital filtering respectively on the converted feedback signals in the respective working frequency bands, and the DPD training module calculates the DPD coefficients corresponding to the input signals subsequently received in the respective working frequency bands according to the processed feedback signals in the respective working frequency bands.

14. A radio remote apparatus, comprising the device according to claim 8.

* * * * *